United States Patent
Matayabas, Jr. et al.

(10) Patent No.: US 7,179,689 B2
(45) Date of Patent: Feb. 20, 2007

(54) PACKAGE STRESS MANAGEMENT

(75) Inventors: James C. Matayabas, Jr., Chandler, AZ (US); Gudbjorg H. Oskarsdottir, Chandler, AZ (US); Mitesh C. Patel, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/282,255

(22) Filed: Nov. 18, 2005

(65) Prior Publication Data

US 2006/0065984 A1    Mar. 30, 2006

Related U.S. Application Data

(62) Division of application No. 10/882,783, filed on Jun. 30, 2004.

(51) Int. Cl.
  H01L 21/44       (2006.01)
  H01L 21/48       (2006.01)
  H01L 21/50       (2006.01)

(52) U.S. Cl. .............. 438/127; 438/124; 438/126; 438/108; 438/118; 438/613; 257/E21.502; 257/E21.503; 257/E21.499

(58) Field of Classification Search ........ 438/106–129, 438/613; 257/E21.502, E21.503, E21.499
See application file for complete search history.

(56) References Cited

U.S. PATENT DOCUMENTS

| | | | |
|---|---|---|---|
| 5,036,024 A | 7/1991 | Mine et al. | |
| 5,274,913 A | 1/1994 | Grebe et al. | |
| 5,331,205 A | 7/1994 | Primeaux | |
| 5,436,203 A | 7/1995 | Lin | |
| 5,641,997 A * | 6/1997 | Ohta et al. | 257/788 |
| 5,807,768 A * | 9/1998 | Shin | 438/127 |
| 6,143,432 A * | 11/2000 | de Rochemont et al. | 428/689 |
| 6,221,509 B1 | 4/2001 | Hirano et al. | |
| 6,372,619 B1 * | 4/2002 | Huang et al. | 438/597 |
| 6,600,234 B2 * | 7/2003 | Kuwabara et al. | 257/790 |
| 6,745,462 B2 * | 6/2004 | Rutiser | 29/841 |
| 6,861,683 B2 | 3/2005 | Rissing et al. | |

FOREIGN PATENT DOCUMENTS

| | | | |
|---|---|---|---|
| JP | 09027573 A * | 1/1997 | |
| TW | 423128 A | 2/2001 | |

* cited by examiner

*Primary Examiner*—B. William Baumeister
*Assistant Examiner*—Igwe U. Anya
(74) *Attorney, Agent, or Firm*—Blakely, Sokoloff, Taylor & Zafman LLP

(57) ABSTRACT

Numerous embodiments of an apparatus and method to stress and warpage of semiconductor packages are described. In one embodiment, a semiconductor die is disposed above a substrate. An encapsulating material is disposed above the substrate and semiconductor die, in which the encapsulating material has a combination of a low coefficient of thermal expansion material and a high coefficient of thermal expansion material.

13 Claims, 5 Drawing Sheets

US 7,179,689 B2

PACKAGE STRESS MANAGEMENT

This is a divisional application of Ser. No. 10/882,783 filed Jun. 30, 2004, which is presently pending.

TECHNICAL FIELD

Embodiments of the present invention relate to the field of semiconductor packages and in one particular embodiment, to a method of managing stress and warpage in semiconductor packages.

BACKGROUND

Integrated circuits (IC) are typically housed within a package that is mounted to a printed circuit board (PCB). The package has conductive leads or pins that are soldered to the PCB and coupled to the IC by a lead frame. One kind of package commonly referred to as a ball grid array (BGA) is an integrated circuit package which has a plurality of solder balls that interconnect the package to a PCB. The solder balls are attached to a polyimide based flexible circuit board which has a number of conductive traces and accompanying solder pads. The integrated circuit die is connected to the solder pads of the flexible circuit by wire bonds and electrically coupled to the solder balls through conductive traces routed across the flexible circuit.

FIG. 1A illustrates a conventional BGA package 100 that includes a substrate 105 with a die 115 (i.e., an IC chip) attached to the substrate 105 using a die attach adhesive 110. The substrate 105 contains embedded multiple horizontal layers of metal conductors (not shown) connected by vertical conductors (not shown). The die 115 is positioned over substrate 105. Inputs/outputs (I/Os) of the die 115 are connected are attached to a bottom surface of the substrate 105 and function as the I/O pins of the BGA package 100. A top surface of the BGA package 100 is encapsulated or overmolded by an epoxy molding (e.g., resin-based) compound 140, for example, by a transfer molding process. In its final form, the package 100 is soldered to a PCB (not shown).

One problem with conventional plastic BGA packages is that they are prone to warping, as illustrated in FIG. 1B. In conventional plastic BGA packages, warpage of substrate 105 occurs after the overmolding process. This warpage poses a problem in placement and attachment of the solder ball joints to a PCB. Overmolded structures, such as the conventional BGA package 100 shown in FIG. 1B, have a mismatch in their CTE (Coefficients of Thermal Expansion) between the epoxy molding compound 140 and the substrate 105. This CTE or thermal mismatch creates interfacial stress as the overmolded structure is cooled to room temperature from elevated processing temperatures, such as during the die attach, wire bonding and overmolding processes. The presence of the mold compound encapsulant 140 on only one side of the substrate 105 creates an unbalanced situation and leads to stress on the substrate 105, resulting in warpage. Warpage creates reliability concerns because it interferes with solder ball attachments and also impacts the integrity of other interfaces present in the package, such as the interface between the mold compound 140 and substrate 105.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

The terms "on," "above," "below," "between," and "adjacent" as used herein refer to a relative position of one layer or element with respect to other layers or elements. As such, a first element disposed on, above or below another element may be directly in contact with the first element or may have one or more intervening elements. Moreover, one element disposed next to or adjacent another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Numerous embodiments of an apparatus and method for stress and warpage management of a semiconductor package (e.g., BGA) are described. In one embodiment, the semiconductor package has encapsulating layers/materials that includes a combination of a low CTE material and a low viscosity, high CTE material. The encapsulating layers/ materials reduce or eliminate package stress and warpage by offsetting the relatively high CTE of package substrate. In one embodiment, the encapsulating layers/materials may be disposed on the semiconductor package with a screen printing process, for example, stencil printing.

Figure 1A:
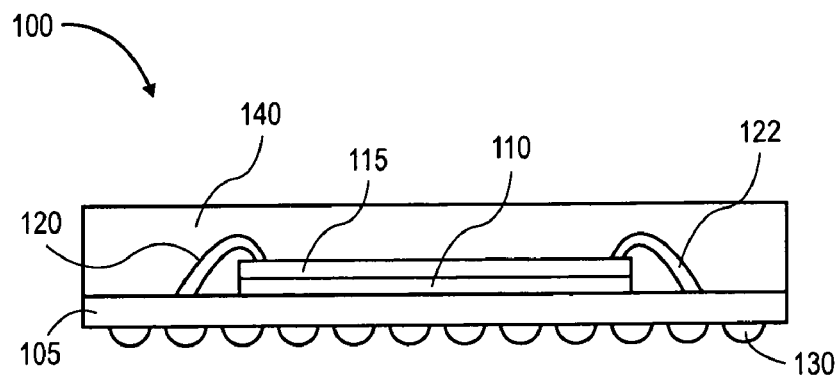
FIGS. 1A and 1B illustrate a conventional semiconductor package.
Figure 1B:
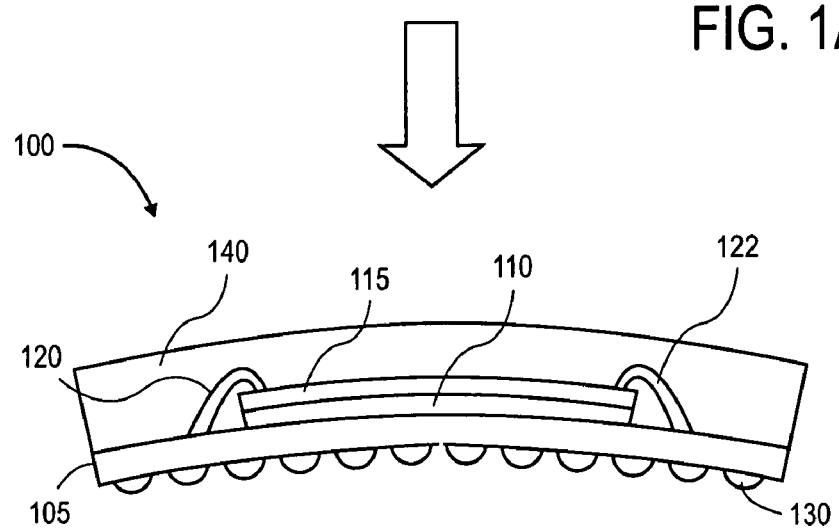
Figure 2:
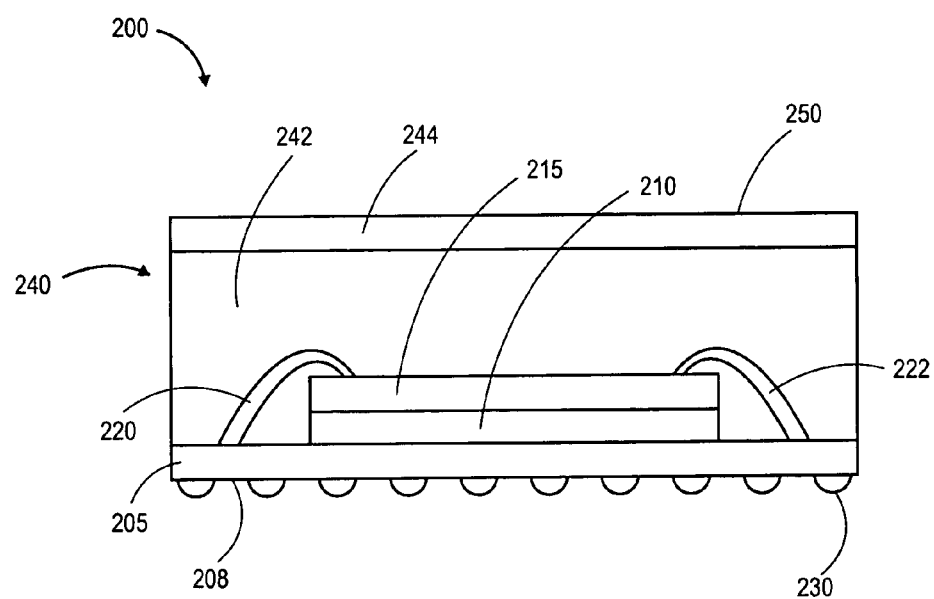
FIG. 2 illustrates a one embodiment of a semiconductor package having multiple encapsulating materials.

FIG. 2 illustrates a cross-sectional view of one embodiment of a semiconductor package 200 (e.g., a BGA) having reduced package stress and/or warpage. Semiconductor package 200 includes a semiconductor die 215 disposed over a substrate 205. A layer of a die adhesive material 210 couples the semiconductor die to substrate 205. Die adhesive materials are known in the art, accordingly, a detailed description is not provided herein. Semiconductor die 215 may be in one embodiment, an integrated circuit, chip, electronic component, such as a processor, a chipset, a memory, a memory controller, graphics controller, etc., housed in semiconductor package 200, for placement on a PCB for electrical interconnectivity with other semiconductor packages. I/Os of the die 215 are connected to conductors disposed within substrate 104 by bonding wires 220, 222.

As shown in FIG. 2, a bottom surface 208 of substrate 205 has an array of solder balls (e.g., solder ball 230) connected thereto. In an alternative embodiment, the solder balls may be substituted by solder columns, gold solder connections, and any other connection methods that are capable of providing electrical interconnect between the semiconductor package and a host device, such as a carrier substrate, package substrate, motherboard, or the like. In one embodiment, each of the balls includes a copper ball coated with nickel and gold. The balls themselves may vary in size, and in one embodiment, may have a diameter in the range of about 20 to about 30 millimeters. Semiconductor package 200 may be coupled to a PCB (not shown) using a vapor-phase or infrared solder reflow process. In either of these reflow processes, solder paste is deposited on the PCB and the array of solder balls is positioned over the solder on the PCB. A heat treatment is carried out so that the solder balls reflow and couple the BGA 200 to the PCB. In an alternative embodiment, other methods known in the art may be used to couple semiconductor package 200 to a PCB.

FIG. 2 also illustrates semiconductor package 200 with an encapsulating material 240 disposed over semiconductor die 215 and substrate 205. In one embodiment, encapsulating material 240 includes a first layer 242 having a low CTE disposed directly over semiconductor die 215 and substrate 205. A second layer 244 of an encapsulating material, having a high CTE relative to the low CTE of first layer 242, is disposed over first layer 242. In one embodiment, the CTE of first layer 242 is less than about 10 parts per million per degree Celsius (ppm/° C.), and the CTE of second layer 244 is about 15 to about 30 ppm/° C. The combination of the low and high CTE encapsulating materials reduces/eliminates package stress and warpage by offsetting the CTE of substrate 205 and semiconductor die 215, respectively. For example, the low CTE of the first encapsulating layer 242 (e.g., about less than 10 ppm/° C.) reduces the CTE mismatch with semiconductor die 205, which may have a CTE of about 2 to about 5 ppm/° C. The relatively higher CTE of the second encapsulating layer 244 (e.g., about 15 to about 30 ppm/° C.) offsets the high CTE of substrate 205, which may also have a CTE of about 15 to about 30 ppm/° C. In an alternative embodiment, the encapsulating material of second layer 244, in addition to having a relatively high CTE, is also of a low viscosity. The combination of a low viscosity, high CTE encapsulating material for second layer 244 produces a smooth, flat surface finish 250, in addition to reducing package stress and warpage. In one embodiment, shrinkage of semiconductor package 200 may occur after curing of first layer 242 and second layer 244; however, the shrinkage is uniform and thus no warpage results.

In one embodiment, the low CTE and high CTE encapsulating materials are formulations of curable resins and additives. A wide variety of curable resins may be used including, but not limited to, epoxies, bismaleimides, bisnadamides, isocyanourates, and the like. The encapsulant formulations for first layer 242 and second layer 244 may also include additives, including but not limited to, curing agents, fillers, catalysts, adhesion promoters, mold release agents, colorants, stabilizers, flame retardants, and the similar additives known in the art.

The thermal expansion coefficient of the formulation may be controlled by selection and concentration of filler, but may also be affected by selection of the resin. In one embodiment, a high loading, as much as about 88 percent by weight, of filler, such as silica may be used to achieve CTE values of less than about 10 ppm/° C. In one embodiment, one method of preparing a higher CTE encapsulant is to prepare a similar formulation for a low CTE material as described but with less filler content, typically about 30 to about 70 percent by weight. This approach provides a higher CTE encapsulant that is compatible with the low CTE encapsulant (e.g., CTE values between about 15 to about 30 ppm/° C.). In another embodiment of this invention, two different base resins may be used, in addition to varying filler concentrations. In yet another embodiment, different fillers or different filler sizes may be used to prepare the high and low CTE encapsulants. An example of a useful liquid epoxy resin is diepoxylated Bisphenol-F. Alternatively, solid epoxy resins, such as diepoxylated tetramethylbiphenol, may be used provided that it is soluble in the other components and additives, or a solvent is added to render the formulation in a liquid state. Examples of useful curing agents for epoxy resins include polyphenols, polyamines, polyanhydrides, and their derivatives.

In one embodiment, processing of a liquid encapsulant may be conducted at about room temperature. In alternative embodiments, higher or lower processing temperatures may be used, provided that the formulation remains liquid and that the cure rate of the formulation is controlled to provide sufficient processing time. In one embodiment, processing conditions may be in the range of about 20° C. to about 80° C.

A model for offsetting stress and warpage of semiconductor package 200 is provided by the Stoney equation, which is given by the following:

$$\sigma_E = \frac{1}{6R} \cdot \frac{E_S d_S^2}{(1-v)d_E}$$

$\sigma_E$=encapsulate stress (observed)
$d_x$=respective thickness of substrate/encapsulate
R=radius of curvature
E=Young's modulus
v=Poisson's ratio A simple warpage model based on the Stoney equation shows that a final overmolded semiconductor package (e.g., package 200) having a combination of low and high CTE encapsulating materials reduces warpage, compared to a final overmolded semiconductor package having only a single mold compound to encapsulate semiconductor die 215 and substrate 205. In alternative embodiments for encapsulating material 240, the stresses of multiple layers of encapsulating materials may be added or integrated to obtain a final overall package warpage model. In one embodiment, the moduli, CTE, and thicknesses of the encapsulating materials may be chosen to that the resultant warpage and/or stress is zero. As mentioned above, shrinkage of semiconductor package 200 may occur, but without warpage because the shrinkage is uniform throughout semiconductor package 200.

In one embodiment, first encapsulating layer 242 and second encapsulating layer 244 of encapsulating material 240 may be disposed on semiconductor package 200 by processes including screen printing and stencil printing. The screen printing process readily permits the use of more than one material that is printed directly over one another prior to curing, and this can be used to manage stress and warpage of the cured product. Screen printing also allows for the formation of a smooth, level top finish, and the use of a different top layer material can aid in achieving a good finish. In addition, the top surface 250 of second encapsulating layer 244 may be further modified to improve abrasion resistance and marking.

In an alternative embodiment, stencil printing may be used to dispose first and second encapsulating materials 242, 244. In stencil printing, a liquid resin epoxy is applied over a predetermined portion of semiconductor package 200 (e.g., semiconductor die 215 and/or substrate 205). A stencil (not shown) is placed over semiconductor package 200, in which a stencil opening is aligned with the predetermined portion. A squeegee (not shown) pushes the liquid resin along a surface of semiconductor package 200, through the stencil opening and onto the predetermined portion. Stencil printing is known in the art, accordingly, a detailed description is not provided herein. Stencil printing provides several advantages over resin transfer molding, for examples, less waste material is produced, and less thermal energy is required (i.e., molds in transfer molding have to be kept hot and at near uniform temperature).

Figure 3:
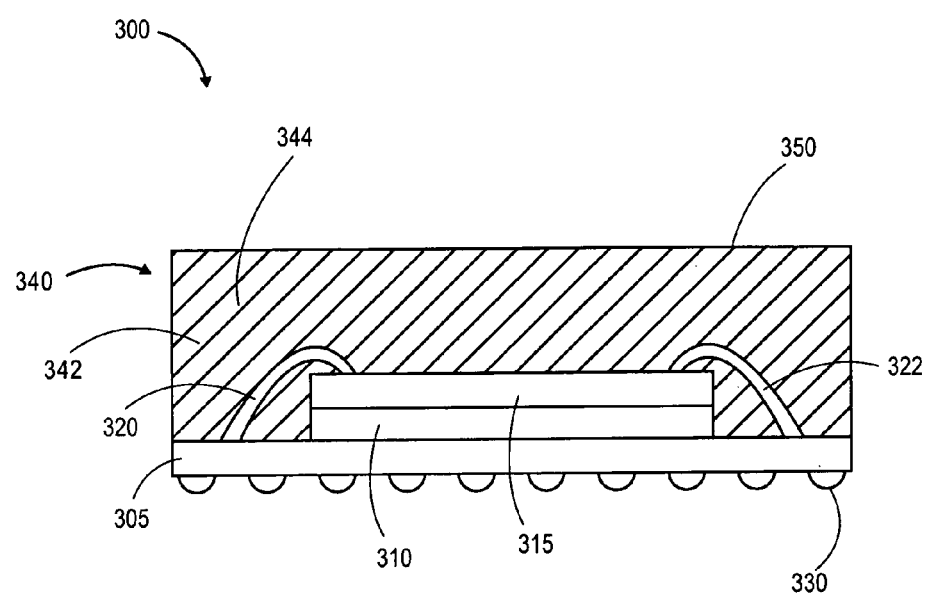
FIG. 3 illustrates another embodiment of a semiconductor package having multiple encapsulating materials.

FIG. 3 illustrates a cross-sectional view of an alternative embodiment of a semiconductor package 300 (e.g., a BGA) having reduced package stress and/or warpage. Semiconductor package 300 includes a semiconductor die 315 disposed over a substrate 305. A layer of a die adhesive material 310 couples the semiconductor die to substrate 305. Die adhesive materials are known in the art, accordingly, a detailed description is not provided herein. Semiconductor die 315 may be in one embodiment, an integrated circuit, chip, electronic component, such as a processor, a chipset, a memory, a memory controller, graphics controller, etc., housed in semiconductor package 300, for placement on a PCB for electrical interconnectivity with other semiconductor packages. I/Os of the die 315 are connected to conductors disposed within substrate 104 by bonding wires 320, 322.

Semiconductor package 300 includes an encapsulating material 340 disposed over semiconductor die 315 and substrate 305. In one embodiment, encapsulating material 240 includes a combination of encapsulating materials, in which a gradient starting with a material 342 having a low CTE disposed or deposited over semiconductor die 315 and substrate 305 gradually changes to a material 344 having a relatively high CTE away from semiconductor die 315 (i.e., as encapsulating material 340 is built up). In one embodiment, the CTE of material 342 is less than about 10 ppm/° C. near substrate 305 and semiconductor die 315 and gradually increases to a CTE of about 15 to about 30 ppm/° C. for material 344 near a top surface 350 of semiconductor package 300. The combination of the low and high CTE encapsulating materials, in the form of an increasing gradient, reduces and/or eliminates package stress and warpage by offsetting the CTE of substrate 305 and semiconductor die 315. For example, the low CTE of the first encapsulating layer 342 (e.g., about less than 10 ppm/° C.) reduces the CTE mismatch with semiconductor die 305, which may have a CTE of about 2 to about 5 ppm/° C. The relatively higher CTE of material 344 near top surface 350 (e.g., about 15 to about 30 ppm/° C.) offsets the high CTE of substrate 305, which may also have a CTE of about 15 to about 30.

In an alternative embodiment, the encapsulating material 344, in addition to having a relatively high CTE, is also of a low viscosity. The combination of a low viscosity and high CTE for material 344 produces a smooth, flat surface finish 350, in addition to reducing package stress and warpage. In one embodiment, shrinkage of semiconductor package 300 may occur after curing of encapsulating material 340; however, the shrinkage is uniform and thus no warpage results, as described above with reference to semiconductor package 200 (i.e., based on the offsetting stresses as modeled by the Stoney equation). In alternative embodiments for encapsulating material 340, the stresses of resulting from the use of multiple materials to form a gradient of encapsulating materials may be added or integrated to obtain a final overall package warpage model. In one embodiment, the moduli, CTE, and thicknesses of the encapsulating materials may be chosen to that the resultant warpage and/or stress is zero.

In one embodiment, the gradient formed by first material 342 and second material 344 may be disposed on semiconductor package 300 by processes including screen printing and stencil printing. As discussed above, the screen printing process readily permits the use of more than one material that is printed directly over one another prior to curing, and this can be used to manage stress and warpage of the cured product. In addition, the top surface 350 of encapsulating material 240 may be further modified to improve abrasion resistance and marking. In an alternative embodiment, stencil printing may be used to form the gradient with material 342 and 344 in a manner similar to that discussed above with respect to semiconductor package 200.

Figure 4:
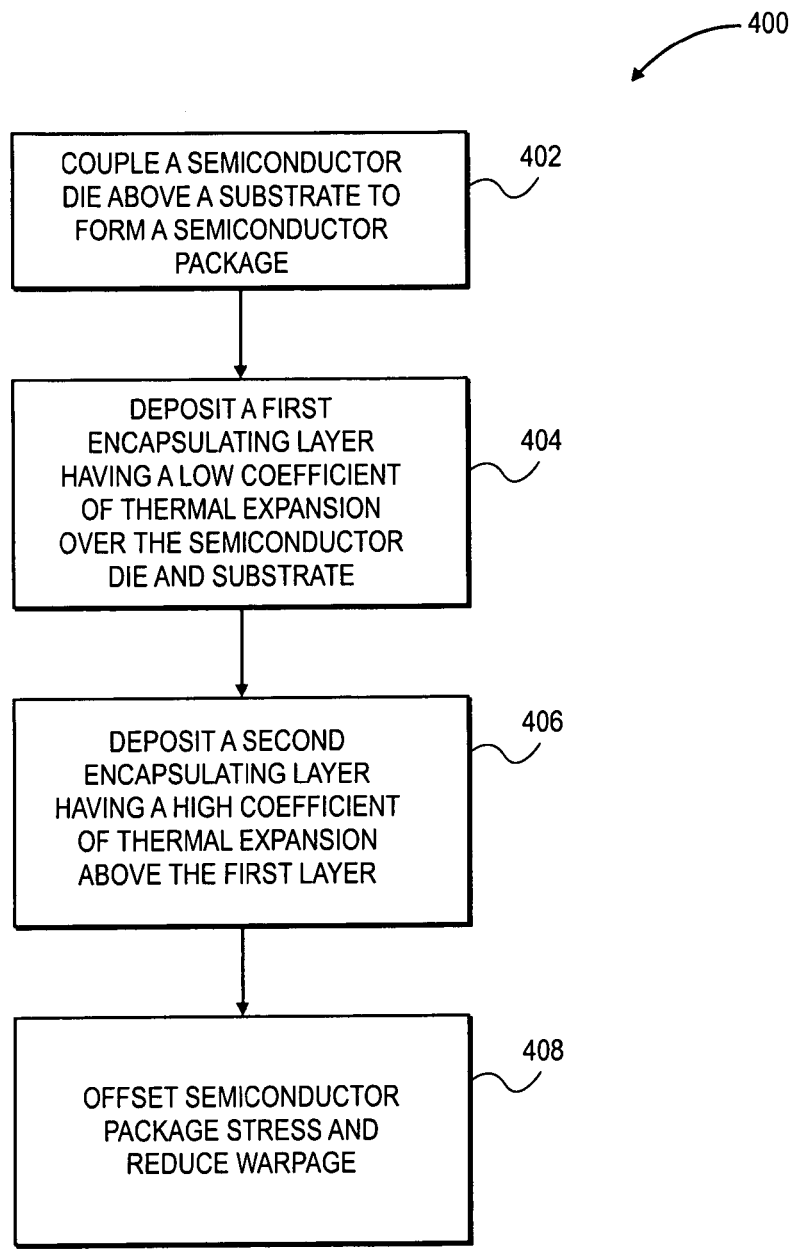
FIG. 4 illustrates a block diagram of one method to manage stress and warpage of a semiconductor package.

FIG. 4 illustrates a block diagram 400 of one method to reduce stress and/or warpage of a semiconductor package (e.g., package 200). A semiconductor package may be formed by a semiconductor die (e.g., semiconductor die 215) coupled to a substrate (e.g., substrate 205), block 402. In one embodiment, a semiconductor die adhesive (e.g., adhesive 210) couples the die above the substrate. An encapsulating layer is disposed over the substrate and semiconductor die, in which the encapsulating layer may be a combination of a low CTE material and a high CTE material. In one embodiment, a first layer of low CTE material is deposited over the semiconductor die and substrate, block 404. Then a second layer of a high CTE material is deposited over the first layer, block 406. In one embodiment, the first and second layers of encapsulating materials may be deposited with a screen printing or stencil printing process. The stresses of multiple layers of encapsulating materials may be added or integrated (e.g., offset the stresses from the semiconductor die and substrate) to obtain a final overall package warpage model, in which the resultant warpage and/or stress is reduced or eliminated, block 408.

In one embodiment, the CTE of the first layer is less than about 10 ppm/° C., and the CTE of the second layer is about 15 to about 30 ppm/° C. The combination of the low and high CTE encapsulating materials reduces/eliminates package stress and warpage by offsetting the CTE of the substrate and semiconductor die. For example, the low CTE of the first encapsulating layer (e.g., about less than 10 ppm/° C.) reduces the CTE mismatch with the semiconductor die, which may have a CTE of about 2 to about 5 ppm/° C. The relatively higher CTE of the second encapsulating layer (e.g., about 15 to about 30 ppm/° C.) offsets the high CTE of the substrate, which may also have a CTE of about 15 to about 30 ppm/° C. In an alternative embodiment, the encapsulating material of the second layer, in addition to having a relatively high CTE, is also of a low viscosity.

Figure 5:
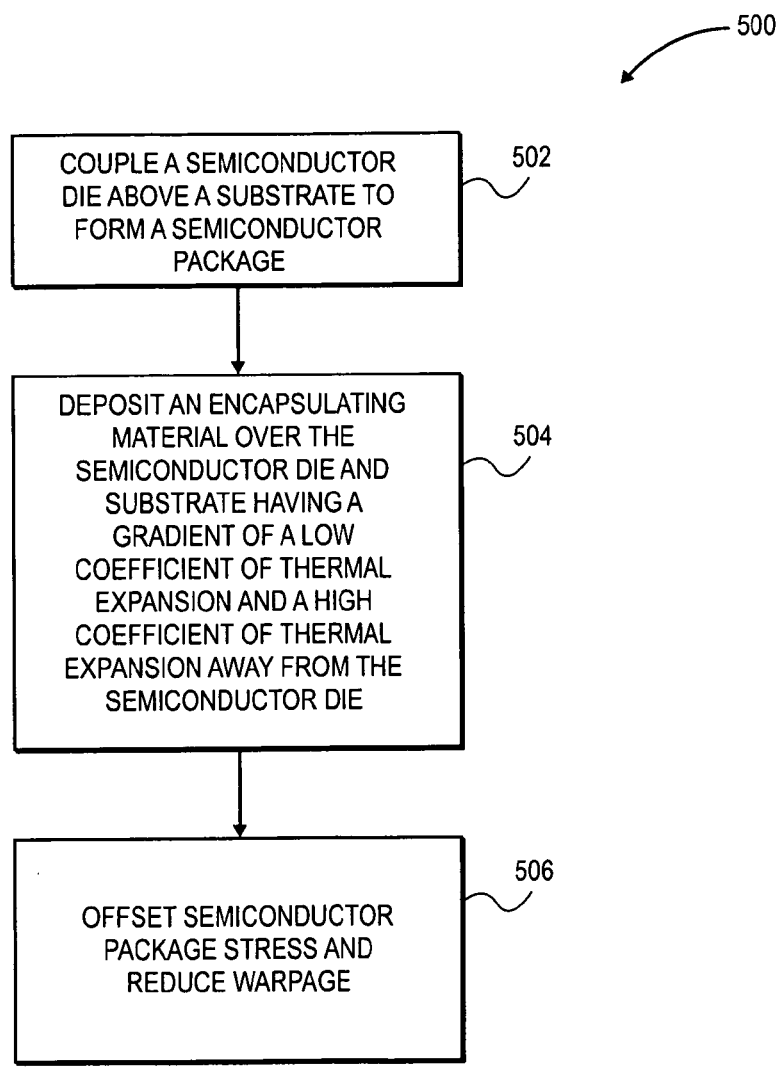
FIG. 5 illustrates a block diagram of another method to manage stress and warpage of a semiconductor package.

FIG. 5 illustrates a block diagram 500 of an alternative method to reduce stress and/or warpage of a semiconductor package (e.g., package 300). A semiconductor package may be formed by a semiconductor die (e.g., semiconductor die 315) coupled to a substrate (e.g., substrate 305), block 502. In one embodiment, a semiconductor die adhesive (e.g., adhesive 310) couples the die above the substrate. An encapsulating layer is disposed over the substrate and semiconductor die, in which the encapsulating layer may be a combination of a low CTE material and a high CTE material. In one embodiment, the encapsulating material forms a gradient of low CTE over the semiconductor die and substrate, gradually increasing to high CTE material in a direction away from the semiconductor die and substrate (e.g. materials 342, 344, of package 300), block 504. In one embodiment, the gradient of encapsulating materials may be deposited with a screen printing or stencil printing process. The stresses of multiple layers of encapsulating materials may be added or integrated (e.g., offset the stresses from the semiconductor die and substrate) to obtain a final overall package warpage model, in which the resultant warpage and/or stress is reduced or eliminated, block 506.

In the foregoing specification, the invention has been described with reference to specific exemplary embodiments thereof. It will, however, be evident that various modifications and changes may be made thereto without departing from the broader spirit and scope of embodiments of the invention as set forth in the appended claims. The specification and figures are, accordingly, to be regarded in an illustrative rather than a restrictive sense.

What is claimed is:

1. A method, comprising:
    coupling a semiconductor die above a substrate; and
    disposing an encapsulating material over the die and substrate, the encapsulating material having a combination of a low coefficient of thermal expansion material and a high coefficient of thermal expansion material, wherein the disposing further comprises depositing a gradient starting with a low coefficient of thermal expansion material to a high coefficient of thermal expansion material.

2. The method of claim 1, wherein disposing further comprises depositing a gradient starting with the low coefficient of thermal expansion material over the semiconductor die, and depositing the high coefficient of thermal expansion material above the low coefficient of thermal expansion material and away from the semiconductor die.

3. The method of claim 2, wherein disposing further comprises offsetting a stress from the semiconductor die with the low coefficient of thermal expansion material and offsetting a stress from the substrate with the high coefficient of the thermal expansion material.

4. The method of claim 1, wherein disposing further comprises screen printing the encapsulating material over the semiconductor die.

5. The method of claim 1, wherein disposing further comprises stencil printing the encapsulating material over the semiconductor die.

6. The method of claim 1, wherein disposing further comprises offsetting a stress from the semiconductor die and a stress from the substrate with the gradient of the low coefficient of thermal expansion material and the high coefficient of thermal expansion material.

7. A method, comprising:
    disposing a semiconductor die above a substrate;
    silk printing an encapsulating layer above the semiconductor die and substrate, wherein a first portion of the encapsulating layer has a coefficient of thermal expansion of about 8 to about 10 parts per million per degree Celsius;
    wherein a second portion of the encapsulating layer has a coefficient of thermal expansion of about 15 to about 30 parts per million per degree Celsius; and wherein the silk printing further comprises depositing a gradient starting with the first portion of encapsulating layer having a coefficient of thermal expansion of about 8 to about 10 parts per million per degree Celsius over the semiconductor die and the second portion having a coefficient of thermal expansion of about 15 to about 30 parts per million per degree Celsius away from the semiconductor die.

8. The method of claim 7, wherein disposing further comprises coupling the semiconductor die above the substrate with a die adhesive.

9. The method of claim 8, wherein silk printing the encapsulating layer further comprises offsetting a stress from the semiconductor die with the first portion of the encapsulating layer and offsetting a stress from the substrate with the second portion of the encapsulating layer.

10. The method of claim 8, wherein silk printing the encapsulating layer further comprises processing the encapsulating layer at about 20° C. to about 80° C.

11. A method, comprising
    coupling a semiconductor die above a substrate, wherein the semiconductor die has a bottom surface proximate to the substrate and a top surface further from the substrate than the bottom surface; and
    disposing an encapsulating material over the semiconductor die and the substrate, the encapsulating material having a combination of a low coefficient of thermal expansion material and a high coefficient of thermal expansion material, wherein the disposing further comprises depositing a gradient starting with the low coefficient of thermal expansion material over the semiconductor die to the high coefficient of thermal expansion material which the high coefficient of thermal expansion material is disposed in a direction perpendicular to and away from the semiconductor die and the substrate.

12. The method of claim 11, wherein the low coefficient of thermal expansion material has a CTE in the range of 8 to about 10 per million per away from the semiconductor die. degree Celsius and the high coefficient of thermal expansion material has a CTE in the range of about 15 to about 30 parts per million per degree Celsius.

13. The method of claim 11, wherein a set of bonding wires couples the semiconductor die and the substrate.

* * * * *

UNITED STATES PATENT AND TRADEMARK OFFICE
CERTIFICATE OF CORRECTION

PATENT NO. : 7,179,689 B2 Page 1 of 1
APPLICATION NO. : 11/282255
DATED : February 20, 2007
INVENTOR(S) : Matayabas, Jr. et al.

It is certified that error appears in the above-identified patent and that said Letters Patent is hereby corrected as shown below:

Column 1, at line 35, after "connected" insert --to these embedded conductors by bonding wires 120, 122. Solder balls (e.g., ball 130)--.

Column 8, at line 47, after "10" insert --parts--.

Column 8, at line 47, delete "away from the semiconductor".

Column 8, at line 48, delete "die.".

Signed and Sealed this

Twenty-fifth Day of December, 2007

JON W. DUDAS
*Director of the United States Patent and Trademark Office*